United States Patent [19]

Terayama

[11] Patent Number: 4,943,952
[45] Date of Patent: Jul. 24, 1990

[54] SEMICONDUCTOR MEMORY CIRCUIT WITH IMPROVED BIT LANE PRECHARGE CIRCUIT

[75] Inventor: Kazuyoshi Terayama, Tokyo, Japan
[73] Assignee: NEC Corporation, Tokyo, Japan
[21] Appl. No.: 290,007
[22] Filed: Dec. 27, 1988
[30] Foreign Application Priority Data
Dec. 25, 1987 [JP] Japan ................... 62-331814
[51] Int. Cl.$^5$ ............................................. G11C 13/00
[52] U.S. Cl. ............................ 365/207; 365/203; 365/189.06; 365/205; 365/333
[58] Field of Search ............ 365/203, 189.06, 194, 365/149, 189.09, 189.11, 207, 205, 190, 233

[56] References Cited

U.S. PATENT DOCUMENTS 4,677,313  1/1987  Mimoto ........................... 365/203
4,716,313 12/1987  Hori et al. ....................... 365/203
4,794,571 12/1988  Uchida ............................ 365/149
4,813,022  3/1989  Matsui et al. .................... 365/190

*Primary Examiner*—Terrell W. Fears
*Attorney, Agent, or Firm*—Sughrue, Mion, Zinn, Macpeak & Seas

[57] ABSTRACT

A dynamic memory circuit provided with an improved bit line reference voltage control circuit realized by a small capacitance of an adjustment capacitor is disclosed. The memory circuit includes a short-circuiting circuit for setting each pair of bit lines at an intermediate voltage of a power source voltage, a capacitor for lowering the intermediate voltage according to charge division based on a ration of a capacitance of the adjustment capacitor and a total capacitance of the bit lines, and a boot-strap circuit for operatively causing a level reduction more than the power source voltage in the capacitor.

7 Claims, 4 Drawing Sheets

SEMICONDUCTOR MEMORY CIRCUIT WITH IMPROVED BIT LANE PRECHARGE CIRCUIT

BACKGROUND OF THE INVENTION

1. Field of the Invention

The present invention relates to a semiconductor memory circuit, and more particularly to a dynamic type semiconductor memory circuit.

2. Description of the Related Art

Dynamic memory circuits have been utilized in various fields as large capacity semiconductor memories.

The dynamic memory circuit is typically constructed in such a manner that one-transistor type memory cells each composed of one transfer gate transistor and a capacitor are arranged in a matrix form of rows and columns with word lines arranged in rows and pairs of bit lines arranged in columns. In each memory cell, storage of information is conducted by existence or non-existence of electric charge in the capacitor. Reading of information is achieved by selecting one of word lines so that electric charge of the memory cell connected to the selected word line is transferred to one bit line in the pair of bit lines of the same column as the selected memory with the other bit line set at a reference voltage. As a result, a small difference in voltage, normally 100 to 200 mV, is generated between the pair of bit lines. This small voltage difference is amplified by a sense amplifier. The amplified signal is read out via an output circuit and also is restored into the preselected memory cell for maintaining information storage.

The reference voltage is usually set at an intermediate level of logic "0" and "1" levels stored in the memory cells. Since the logic "1" and "0" levels are set at a power source voltage $V_{cc}$ and a ground potential (GND), respectively, the reference voltage is practically set at $\frac{1}{2}$ Vcc level.

In order to set the pair of bit lines at the reference voltage approximately of $\frac{1}{2}$ Vcc in a stand-by or precharge period, the pair of bit lines provided with the amplified "1" (Vcc) and "0" (GND) levels, respectively, in the previous active period, are short-circuited in this precharge period. As a result, the pair of bit lines are balanced approximately to a $\frac{1}{2}$ Vcc level. In the above $\frac{1}{2}$ Vcc precharging method, since the balanced potential at the bit lines is the intermediate potential between the bit line potential when stored information in the memory cell is high and the bit line potential when it is low, the balanced potential can theoretically be deemed as a reference voltage.

However, in reality, it is often desired from many reasons that the reference voltage be slightly lower than the above balanced potential ($\frac{1}{2}$ Vcc), e.g. by 0.5 V. In order to obtain the above featured reference voltage smaller than the balanced ($\frac{1}{2}$ Vcc) level, the balanced potential of $\frac{1}{2}$ Vcc is capacitively pulled down by an adjustment capacitor. Namely, after the pair of bit lines are equalized to the balanced potential, a part of electric charges of the pair of bit lines are discharged to the adjustment capacitor. In practical case, in order to reduce the number of the adjustment capacitors, one adjustment capacitor is commonly used to pull down potentials of a plurality pairs of bit lines and therefore, the adjustment capacitor must have a large capacitance. This large capacity of the adjustment capacitor occupies a large area on a semiconductor chip, resulting in an increase in the size of the chip.

SUMMARY OF THE INVENTION

It is an object of the present invention to provide a dynamic semiconductor memory circuit which can be fabricated on a small size of semiconductor chip.

It is another object of the present invention to provide a dynamic memory circuit provided with an improved bit line precharge circuit realized by a reduced capacitance of capacitor.

The semiconductor memory circuit according to the present invention comprises word lines arranged in rows, a pair of bit lines arranged in column, memory cells coupled to the word lines and bit lines, a sense amplifier coupled to the pair of bit lines for operatively amplifying one of the pair of bit lines to a first voltage and the other of the pair of bit lines to a second voltage smaller than the first voltage during a first time period, a capacitor having first and second ends, first switching means for operatively short-circuiting the pair of bit lines during a second time period and a third time period after the second time period, the first switching means setting the pair of bit lines at a third voltage between the first and second voltages during the second time period, second switching means for operatively connecting the pair of bit lines to said first end of the capacitor during the second and third time period, and a control circuit coupled to the capacitor, the control circuit operatively setting the first and second ends of the capacitor approximately at the second voltage and the first voltage, respectively by end of the first time period, the first and second ends of the capacitor being raised by approximately the third voltage, respectively when the second switching means is enabled during the second period, the control circuit setting the second end of the capacitor approximately to the second voltage during the third time period thereby to set the potential of the pair of bit lines at a fourth voltage between the third and second voltage during the third time period.

According to the present invention, the second of the capacitor is boosted-up to a high voltage when the short-circuited bit lines are connected to the first end of the capacitor. Thereafter, the high voltage at the second end of the capacitor is discharged. Accordingly, a large amount of electric charges are discharged in this instance. Thus, a relatively small capacitance of the capacitor can adjust the voltage at the bit line effectively.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Prior Art

Figure 1:
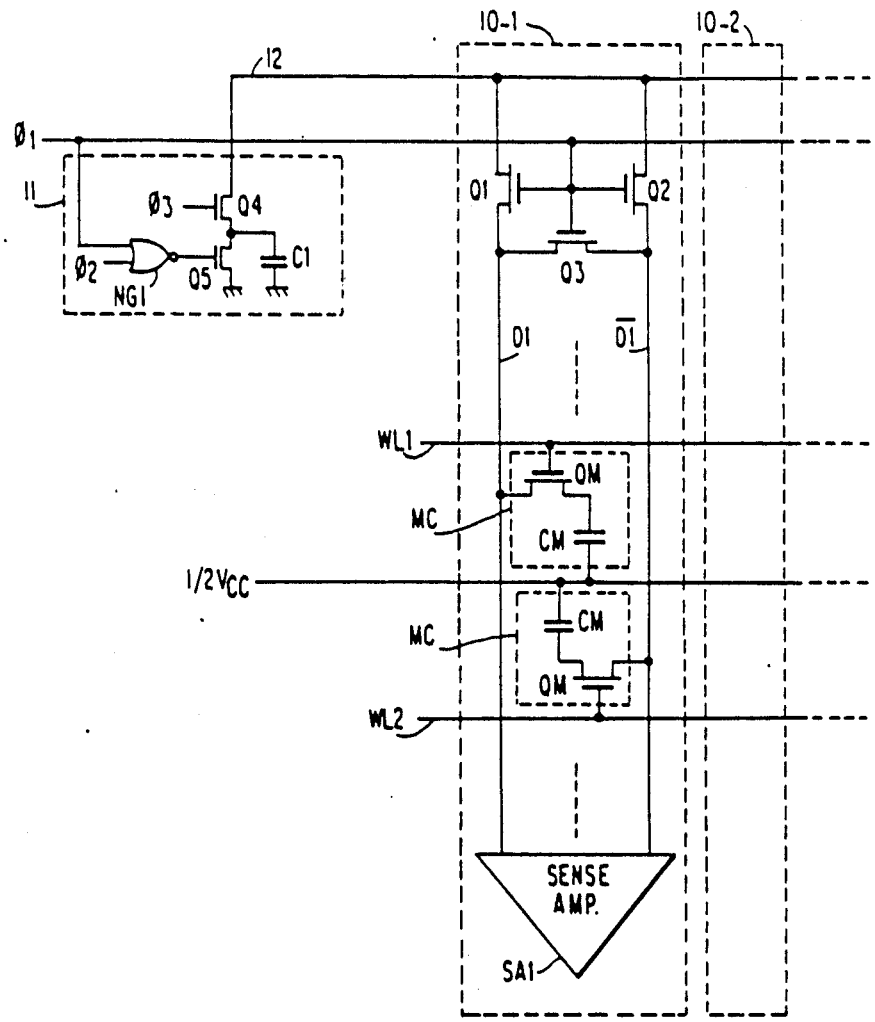
FIG. 1 is a schematic block diagram of a major part of a semiconductor memory circuit in the prior art.
Figure 2:
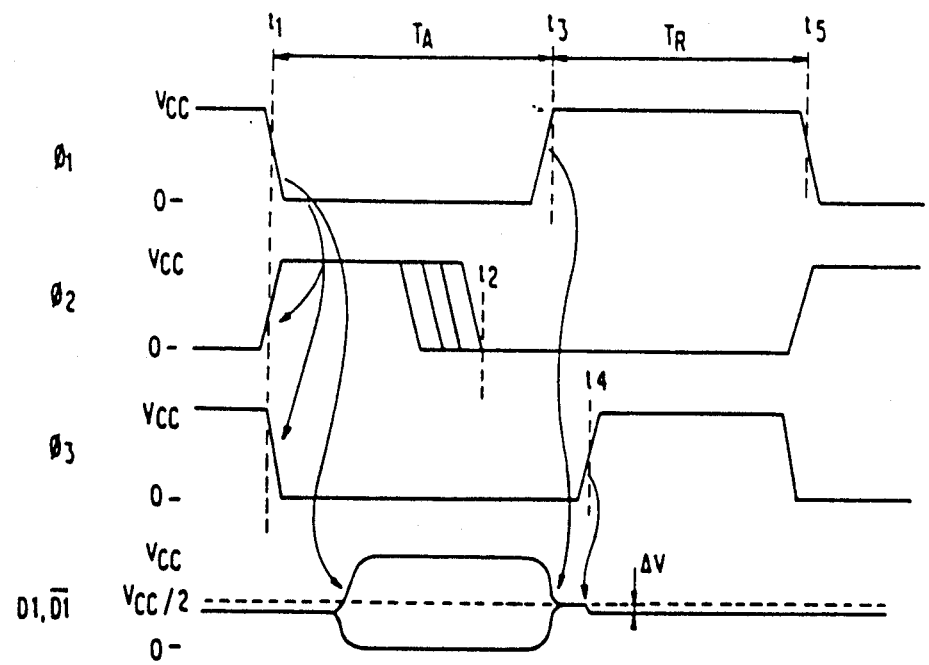
FIG. 2 is a timing diagram showing operation of the memory circuit of FIG. 1.

With reference to FIGS. 1 and 2, the semiconductor memory circuit in the prior art will be explained.

A major part of the memory circuit in the prior art is shown in FIG. 1. In FIG. 1 one column of memory arrangement 10-1 is representatively illustrated among a plurality of columns of memory arrangements 10-1, 10-2 .... The column arrangement 10-1 includes a pair of bit lines $D_1$, $\overline{D_1}$ intersecting with a plurality of word lines such as $WL_1$, $WL_2$, a sense amplifier SA1, one-transistor type memory cells each composed of a storage capacitor $C_M$ and a memory cell transistor $Q_M$, and precharge transistors $Q_1$, $Q_2$ and $Q_3$.

A level adjustment circuit 11 is provided in common for the columns of memory arrangements 10-1, 10-2. The transistors $Q_1$ and $Q_2$ are connected between the pair of bit lines $D_1$, $\overline{D_1}$ and a discharge line 12 while the transistor $Q_3$ is connected between the pair of bit lines $D_1$, $\overline{D_1}$ for operatively short-circuiting them.

The level adjustment circuit 11 includes a discharge capacitor $C_1$, MOS field effect transistors $Q_4$, $Q_5$ and a NOR gate NG1. Common plate of the storage capacitors are provided with an intermediate voltage ($\frac{1}{2}$ Vcc) of a power source voltage Vcc which is utilized in common in this memory circuit.

Operations of the memory circuit of FIG. 1 will be explained with reference to FIG. 2.

At a time point $t_1$, an active period $T_A$ is introduced into the memory circuit and a precharge signal $\phi_1$ and a control signal $\phi_2$ are fallen in potential while a control signal $\phi_2$ rises for a predetermined duration. After the active period $T_A$ is initiated, one of word lines is selected to cause a small signal difference between each pair of bit lines and thereafter each sense amplifier such as SA1 is enabled to amplifies the small signal difference between each pair of bit lines. As a result, in each pair of bit lines e.g. $D_1$, $\overline{D_1}$, one bit line is raised to the Vcc level while the other bit line is fallen to the ground potential. At a time point $t_2$, the control signal $\phi_2$ falls so that the transistor $Q_5$ of the circuit 11 is rendered conductive to discharge the capacitor $C_1$ in response to a high level output of the NOR gate NG1. At a time point $t_3$, the control signal $\phi_1$ is raised to the Vcc level and a standby or precharge period $T_R$ is introduced. In this period, the transistors $Q_1$ to $Q_3$ are made conductive so that each pair of bit lines are short-circuited by the transistor $Q_3$ and also connected to the line 12 through the transistors $Q_1$ and $Q_2$. In this instance, the transistor $Q_4$ is not conductive and therefore the pair of bit lines are balanced approximately at $\frac{1}{2}$ Vcc level. At a time point $t_4$, the control signal $\phi_3$ is raised to render the transistor $Q_4$ conductive, while the transistor $Q_5$ is already made non-conductive in response to the rise of $\phi_1$ at $t_3$. Accordingly, the line 12 is connected to the capacitor $C_1$ through the transistor $Q_4$. As a result, the balanced level of each pair of bit lines is slightly lowered e.g. by 0.5 V from the $\frac{1}{2}$ Vcc level because a part of electric charges on the respective bit lines flows into the capacitor $C_1$. The final level $V_R$ of the respective bit lines is determined by the following equation (1):

$$V_R = C_1/C_1 + C_{TD} \times Vcc/2 \qquad (1)$$

In the equation (1), $C_1$ and $C_{TD}$ denote a capacitance of the capacitor $C_1$ and the total capacitance of the bit lines associated to the line 12.

In the above-mentioned conventional memory circuit, however, the amount of electric charge to be adjusted is so large that a large capacitor must be employed as $C_1$ for effecting the above adjustment, and the capacitor $C_1$ occupies an increased area on the chip resulting in an increase in the size of the chip.

Figure 3:
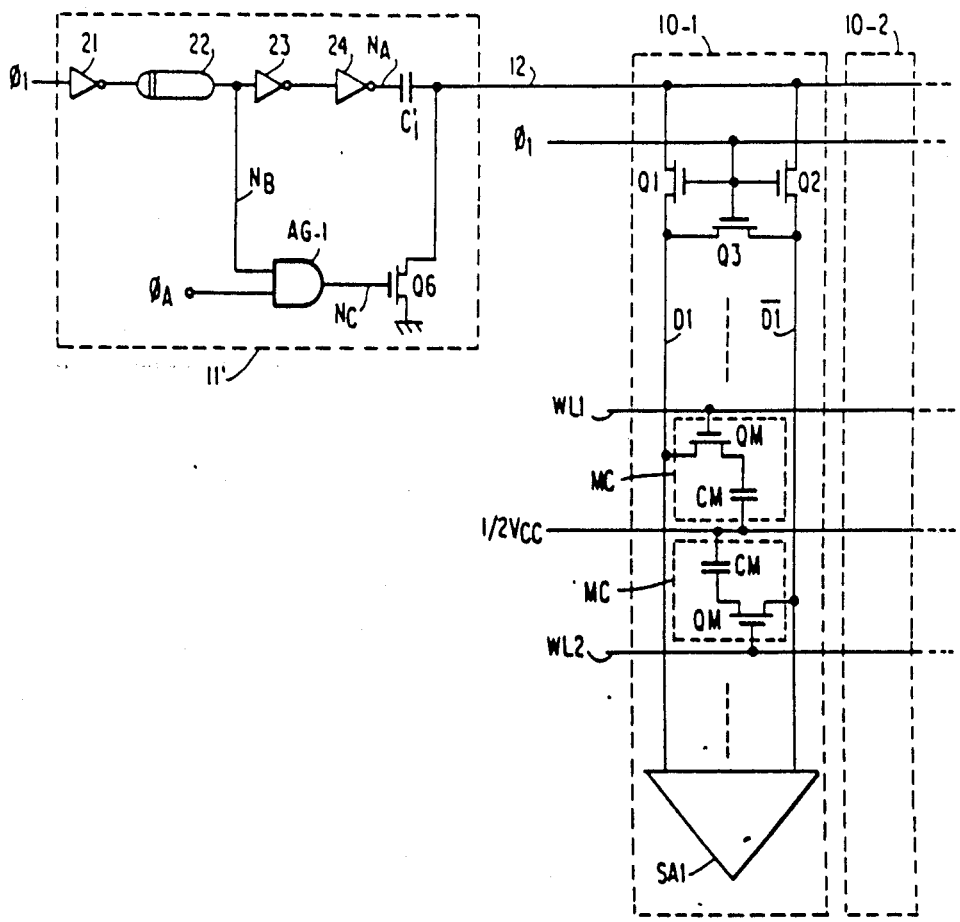
FIG. 3 is a schematic block diagram showing a major part of the memory circuit according to a preferred embodiment of the present invention.
Figure 4:
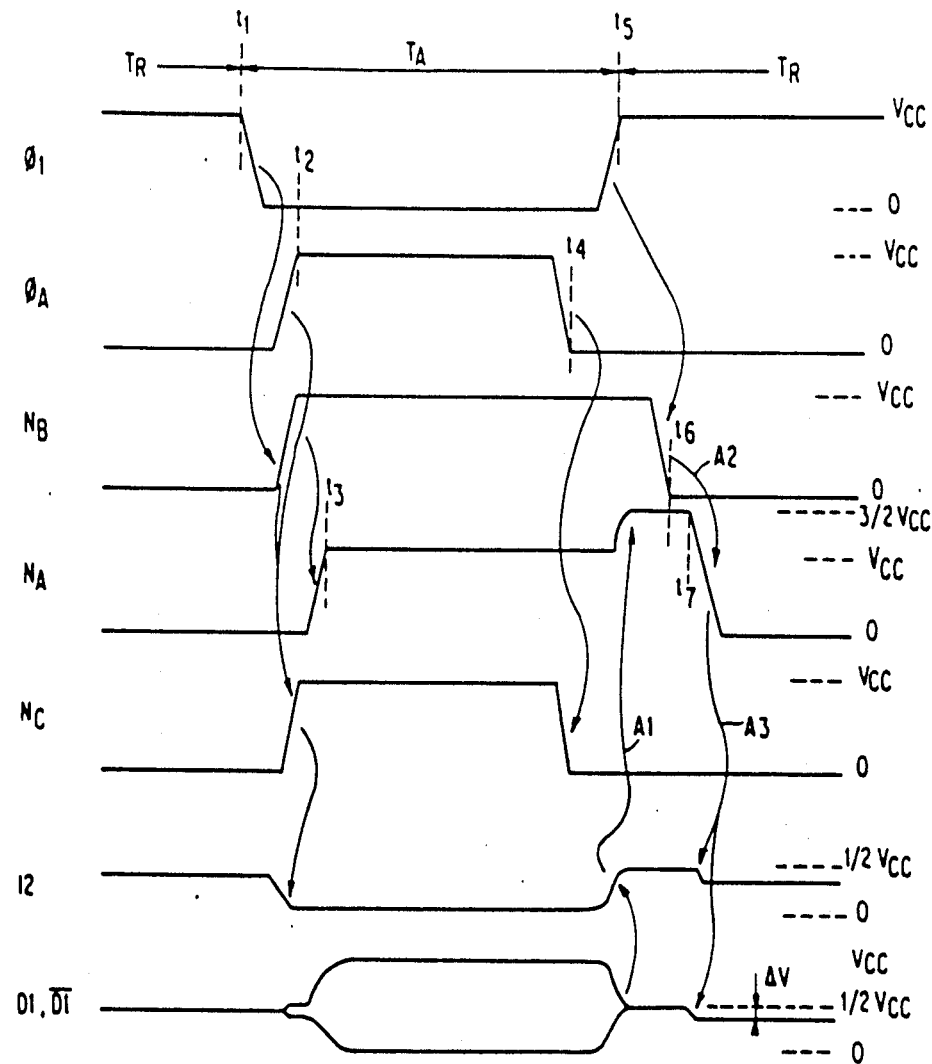
FIG. 4 is a timing diagram showing operation of the memory circuit of FIG. 3.

With reference to FIGS. 3 and 4, a major part of the memory circuit according to one embodiment of the invention will be explained.

As is shown in FIG. 3, the memory circuit according to the present embodiment is obtained by replacing the level adjustment circuit 11 of FIG. 1 with a novel level adjustment circuit 11'.

The circuit 11' includes a reset transistor $Q_6$, a capacitor $C_1'$, inverters 21, 23, 24, a delay circuit 22 and an AND gate AG1. The inverters 23 and 24 connected in cascade serve as a kind of delay circuit having a relatively small delay time to ensure charge up of the capacitor $C_1'$ as explained below.

Operations of the memory circuit of FIG. 3 will be explained with reference to FIG. 4.

At a time point $t_1$, the control signal $\phi_1$ falls to the ground potential and the active period TA is initiated. After a predetermined delay due to the delay time of the delay circuit 22 from $t_1$, a potential at a node $N_B$ rises while a control signal $\phi_A$ which becomes active within the active period rises at a time point $t_3$ so that an output $N_C$ of the AND gate AG1 becomes high in level. In response to the rise of $N_C$, the transistor $Q_6$ becomes conductive to set the line 12 at the ground potential, while the output $N_A$ of the inverter 24 becomes the Vcc level after the rise of $N_B$. Thus, the capacitor $C_1'$ is charged with the Vcc level.

While, in this instance, the transistors $Q_1$ and $Q_3$ are non-conductive and one of word lines is selected and a signal difference between each pair of bit lines is amplified by each sense amplifier.

Then, at a time point $t_4$, the control signal $\phi_A$ falls and the output $N_C$ of the AND gate AG1 is therefore fallen. Thus, the transistor $Q_6$ is made non-conductive to isolate the line 12 from the ground potential. At a time point $t_5$, the control signal is changed to the Vcc level from the ground level and the standby period $T_R$ is initiated. In response to the rise of $\phi_1$, the transistors $Q_1$ to $Q_3$ are rendered conductive so that the pair of bit lines are balanced to an intermediate level $\frac{1}{2}$ Vcc and the line 12 is also raised to the $\frac{1}{2}$ Vcc level. This rise of the line 12 from the ground level to the intermediate level is transferred to the node $N_A$ through the capacitor $C_1'$ charged with the Vcc level.

As a result, the potential at the node $N_A$ is further raised to the potential of (Vcc + $\frac{1}{2}$ Vcc) level as illustrated by an arrow A1 in FIG. 4. While, the output $N_B$ falls in potential at a time point $t_6$ and thereafter the potential at the node $N_A$ is fallen from the 3/2 Vcc level to the ground potential by the inverter 24 as indicated by an arrow A2. In response to this change in $N_A$, electric charges stored in the capacitor $C_1'$ are discharged and the level of the pair of bit lines is lowered by V in accordance with the above discharged electric charges, as indicated by an arrow A3. In this instance, whole amount of electric charges Q discharged from the pairs of bit lines connected to the line 12 is expressed by the following equation (2).

$$Q = C_1' \times (Vcc + \frac{1}{2} Vcc) = 3/2\ C_1' Vcc \qquad (2)$$

(C' being a capacitance of the capacitor $C_1'$)

To the contrary, the same amount of electric charges discharged in the memory circuit of FIG. 1 is expressed by the following equation (3);

$$Q = C_1' \cdot V_{cc} \quad (3)$$

As will be apparent from the equations (2) and (3), a relationship $C_1' = \frac{1}{3} C_1$ is obtained. Thus, according to the memory circuit of the present invention, the capacitor $C_1'$ has one-third capacitance of that of the capacitor $C_1$ of FIG. 1. For example, if the capacitance of the capacitor $C_1$ is 1800 PF in FIG. 1, the memory circuit according to this embodiment is achieved by the capacitor $C_1'$ having 600 PF. As a result, the semiconductor chip on which the memory circuit is fabricated can be reduced in size.

I claim:

1. A semiconductor memory circuit comprising: a pair of bit lines, a plurality of word lines intersecting with said pair of bit lines, a plurality of dynamic type memory cells coupled to said word lines and said bit lines, a sense amplifier coupled to said pair of bit lines for operatively amplifying one of said pair of bit lines to a first voltage and the other of said pair of bit lines to a second voltage lower than said first voltage, a pair of first switch elements having current paths connected between said pair of bit lines and a common node, respectively, a capacitor having a first end coupled to said common node and a second end, means for enabling said first switch elements simultaneously in response to a first control signal which is activated after said pair of bit lines are amplified by said sense amplifier thereby to place said pair of bit lines at a third voltage between said first and second voltages, a second switch element having a current path connected between said common node and a voltage terminal set approximately at said second voltage, a first delay circuit, means for applying a second control signal to an input end of said first delay circuit, said second control signal being opposite to said first control signal, a second delay circuit having an output end connected to said second end of said capacitor, means for connecting an output end of said first delay circuit to an input end of said second delay circuit, and gate means having a first input end coupled to the output end of said first delay circuit and a second input end receiving a third control signal, said third control signal being activated when said pair of bit lines are amplified, said gate means rendering said second switch element conductive when both of said first and second input ends of said gate means are activated.

2. The semiconductor memory circuit according to claim 1, further comprising a third switch element having a current path connected directly between said pair of bit lines and means for rendering said third switch element conductive when said pair of first switch elements are rendered conductive.

3. The semiconductor memory circuit according to claim 1, in which each of said first switch elements includes a field effect transistor.

4. The semiconductor memory circuit according to claim 1, in which said gate means includes an AND gates.

5. The semiconductor memory circuit comprising: a plurality of pairs of bit lines, a plurality of word lines intersecting with said bit lines, a plurality of dynamic type memory cells coupled to said bit lines and said word lines, a plurality of sense amplifiers, one of said sense amplifiers being connected to each pair of said bit lines for operatively amplifying one of the associated pair of bit lines to a first voltage and the other of said associated pair of bit lines to a second voltage lower than said first voltage, a common line, a plurality of pairs of first switch elements connected between said common line and said pairs of bit lines, respectively, means for rendering said pairs of first switch elements conductive simultaneously in response to a first control signal which is made active after the amplification of said pairs of bit lines by said sense amplifiers, a capacitor having a first end coupled to said common line and a second end coupled to the output end of a first delay circuit, means for supplying the input end of said first delay circuit with a second control signal having an opposite phase to said first control signal, a second switch element connected between said common line and a terminal supplied with a voltage approximately of said second voltage, and first means for receiving a third control signal which becomes active after said first control signal is made inactive and becomes inactive before said first control signal is made active, and a control circuit having a first input end coupled to the output end of said first delay circuit and a second input end supplied with said third control signal, said control circuit rendering said second switch element conductive when both of said first and second input ends are active.

6. The semiconductor memory circuit according to claim 5, in which each of said memory cells includes a storage capacitor having a first end connected to a cell voltage line and a second end and a transfer field effect transistor having a current path connected between the second end of said storage capacitor and one of said bit lines and a gate connected to one of said word lines.

7. The semiconductor memory circuit according to claim 5, further comprising a plurality of third switch elements one connected between each pair of said bit lines.

* * * * *